United States Patent
Lewis et al.

(10) Patent No.: US 7,663,242 B2
(45) Date of Patent: Feb. 16, 2010

(54) THERMAL INTERFACE MATERIAL AND SOLDER PREFORMS

(76) Inventors: Brian G. Lewis, 600 Route 440, Jersey City, NJ (US) 07304; Bawa Singh, 600 Route 440, Jersey City, NJ (US) 07304; John P. Laughlin, 4902 N. Babino Gulch Ct., Tucson, AZ (US) 85750; David V. Kyaw, 6995 S. Goshawk Dr., Tucson, AZ (US) 85706; Anthony E. Ingham, Forsyth Road, Sheerwater Woking, Surrey GUZ1 5RZ (GB); Attiganal N. Sreeram, 2545 N. Running Deer La., Midland, MI (US) 48642; Leszek Hozer, 600 Route 440, Jersey City, NJ (US) 07304; Michael J. Liberatore, 600 Route 440, Jersey City, NJ (US) 07304; Gerard R. Minogue, 5031 Casa Loma Ave., Yorba Linda, CA (US) 92886

( * ) Notice: Subject to any disclaimer, the term of this patent is extended or adjusted under 35 U.S.C. 154(b) by 75 days.

(21) Appl. No.: 11/682,729

(22) Filed: Mar. 6, 2007

(65) Prior Publication Data

US 2007/0145546 A1 Jun. 28, 2007

Related U.S. Application Data

(60) Division of application No. 10/722,288, filed on Nov. 25, 2003, now Pat. No. 7,187,083, which is a continuation-in-part of application No. 10/151,741, filed on May 20, 2002, now Pat. No. 6,653,741.

(60) Provisional application No. 60/306,218, filed on Jul. 18, 2001, provisional application No. 60/293,457, filed on May 24, 2001.

(51) Int. Cl.
*H01L 23/48* (2006.01)

(52) U.S. Cl. ............ 257/772; 257/779; 257/705; 257/706; 257/720; 257/E23.023; 257/E23.026

(58) Field of Classification Search ............ 257/772, 257/779, E23.015, E23.02, E23.023–E23.079, 257/E21.508–E21.509, E21.519; 438/612–617
See application file for complete search history.

(56) References Cited

U.S. PATENT DOCUMENTS 3,996,548 A 12/1976 Chaffin, III (Continued)

FOREIGN PATENT DOCUMENTS

EP 1153698 A1 11/2001

(Continued)

OTHER PUBLICATIONS

Abstract of JP2001127375; May 11, 2001.

(Continued)

*Primary Examiner*—Jasmine J Clark
(74) *Attorney, Agent, or Firm*—Senninger Powers LLP

(57) ABSTRACT

A solder preform having multiple layers including a solder layer filled with additives interposed between two unfilled layers for improved wettability. A solder preform having a sphere which contains a solder material filled with additives, and an unfilled surface layer for improved wettability. A thermal interface material having a bonding component and an additive component which is a CTE modifying component and/or a thermal conductivity enhancement component. Active solders containing intrinsic oxygen getters.

40 Claims, 1 Drawing Sheet

U.S. PATENT DOCUMENTS

| | | | |
|---|---|---|---|
| 4,670,770 A | 6/1987 | Tai | |
| 4,819,857 A | 4/1989 | Mizuishi et al. | |
| 4,954,870 A | 9/1990 | Takemura et al. | |
| 5,023,697 A | 6/1991 | Tsumura | |
| 5,066,544 A | 11/1991 | Betrabet et al. | |
| 5,082,162 A | 1/1992 | Kamiyama et al. | |
| 5,097,387 A | 3/1992 | Griffith | |
| 5,240,172 A | 8/1993 | Steinke et al. | |
| 5,242,658 A | 9/1993 | Stevens et al. | |
| 5,256,370 A | 10/1993 | Slattery et al. | |
| 5,306,950 A | 4/1994 | Fujikawa et al. | |
| 5,471,092 A | 11/1995 | Chan et al. | |
| 5,503,286 A | 4/1996 | Nye, III et al. | |
| 5,552,234 A | 9/1996 | Kawasumi | |
| 5,635,764 A | 6/1997 | Fujikawa et al. | |
| 5,755,896 A | 5/1998 | Paruchuri et al. | |
| 5,907,474 A | 5/1999 | Dolbear | |
| 5,918,795 A | 7/1999 | Yamaguchi et al. | |
| 5,938,862 A | 8/1999 | Yeh et al. | |
| 6,047,876 A | 4/2000 | Smith | |
| 6,059,900 A | 5/2000 | Gayle et al. | |
| 6,176,947 B1 | 1/2001 | Hwang et al. | |
| 6,205,264 B1 | 3/2001 | Jin et al. | |
| 6,231,693 B1 | 5/2001 | Lugscheider et al. | |
| 6,283,359 B1 | 9/2001 | Brofman et al. | |
| 6,285,079 B1 | 9/2001 | Kunikiyo | |
| 6,300,164 B1 | 10/2001 | Call et al. | |
| 6,306,516 B1 | 10/2001 | Jin et al. | |
| 6,312,535 B1 | 11/2001 | Leatham et al. | |
| 6,319,461 B1 | 11/2001 | Domi et al. | |
| 6,319,617 B1 | 11/2001 | Jin et al. | |
| 6,326,685 B1 | 12/2001 | Jin et al. | |
| 6,337,445 B1 | 1/2002 | Abbott et al. | |
| 6,365,973 B1 | 4/2002 | Koning | |
| 6,504,242 B1 | 1/2003 | Deppisch et al. | |
| 6,562,648 B1 * | 5/2003 | Wong et al. | 438/46 |
| 6,653,741 B2 | 11/2003 | Sreeram et al. | |
| 6,677,185 B2 | 1/2004 | Chin et al. | |
| 6,781,065 B1 | 8/2004 | Palmteer | |
| 6,906,417 B2 | 6/2005 | Jiang et al. | |
| 2002/0175403 A1 | 11/2002 | Sreeram et al. | |
| 2005/0069725 A1 | 3/2005 | Boaz | |

FOREIGN PATENT DOCUMENTS

| | | | |
|---|---|---|---|
| EP | 1564803 A1 | 8/2005 | |
| GB | 2327150 A | 1/1999 | |
| JP | 62197292 A | 8/1987 | |
| JP | 62212095 | 9/1987 | |
| JP | 62263895 | 11/1987 | |
| JP | 1126335 | 5/1989 | |
| JP | 1149378 A | 6/1989 | |
| JP | 4-155949 * | 5/1992 | 258/782 |
| JP | 05070252 | 3/1993 | |
| JP | 6-112515 * | 4/1994 | 257/614 |
| JP | 6318655 A | 11/1994 | |
| JP | 9172224 | 6/1997 | |
| JP | 200185584 | 3/2001 | |
| JP | 2001127375 | 5/2001 | |
| JP | 2002124524 | 4/2002 | |
| JP | 2002368020 | 12/2002 | |
| NL | 9200564 | 10/1993 | |
| WO | 9902299 A1 | 1/1999 | |
| WO | 0134860 A1 | 5/2001 | |

OTHER PUBLICATIONS

Abstract of JP2002124524; Apr. 26, 2002.
Abstract of 2002368020; Dec. 20, 2002.
Abtew et al., "Lead Free Solders in Microelectronics", Materials Science and Engineering, vol. 27, No. 5 Jun. 1, 2000 , pp. 95-141, Elsevier.
Supplementary European Search Report issued in connection with EP 03769013, dated Aug. 14, 2007, 3 pages.
Supplementary European Search Report issued in connection with EP 02747847.8-1235, dated Sep. 20, 2007, 2 pages.
English Language Translation of WO 01/34860.
European Examination Report, European Patent Application No. 03769013.8, dated Feb. 27, 2008, 7 pages.
Beisswenger, S., "Das Oxidationsverhalten von Cu-Zn-Al-Legierungen bei hoher Temperatur," Werkstoffe Und Korrosion, 1976, pp. 159-164, vol. 27, No. 3.
Mavorri, H. et al., Universal Solders for Direct and Powerful Bonding on Semiconductors, Diamond, and Optical Materials, Applied Physics Letter, (2001), pp. 2976-2978, vol. 78:19.
International Search Report from PCT/US02/15870 dated Apr. 10, 2003, 4 pages.
English Language Abstract of JP 05070252.
English Language Abstract of JP 62212095.
English Language Abstract of JP 62263895.
English Language Abstract of JP 9172224.
English Language Abstract of JP 1126335.
English Language Abstract of NL 9200564.
European Examination Report for EP 03 769 013.8 dated Jul. 31, 2009, 7 pages.
English Language Abstract of JP 62197292; Aug. 31, 1987.
English Language Abstract of JP 1149378; Jun. 12, 1989.
English Language Abstract of JP 6318655; Nov. 15, 1994.
English Language Abstract of JP 200185584; Jan. 30, 2001.

* cited by examiner

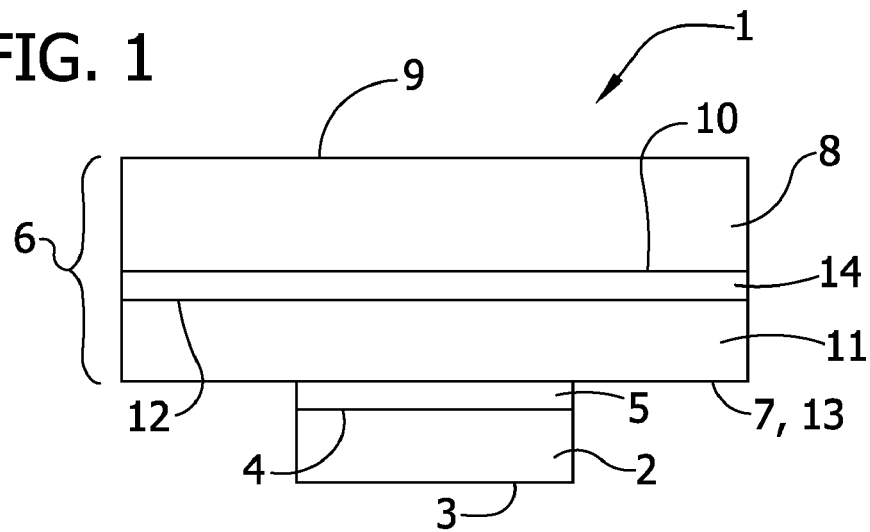
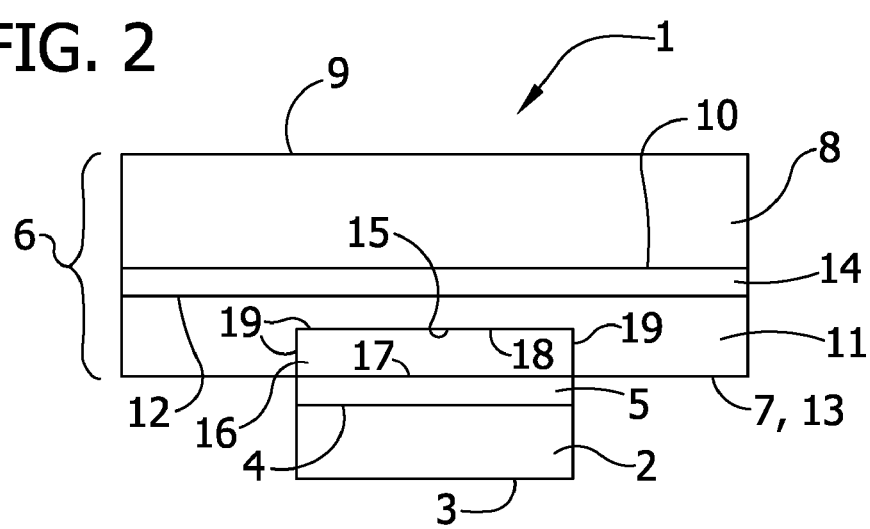
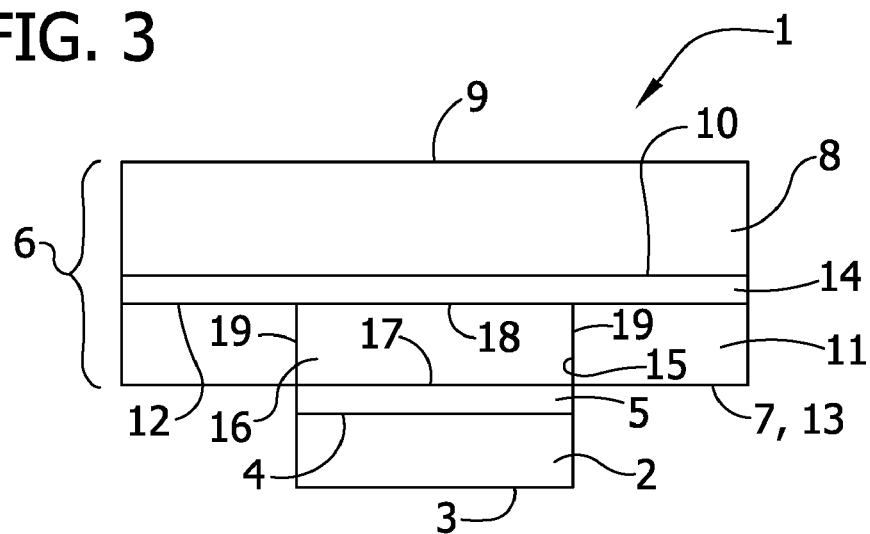

THERMAL INTERFACE MATERIAL AND SOLDER PREFORMS

CROSS-REFERENCE TO RELATED APPLICATIONS

This application is a divisional of U.S. application Ser. No. 10/722,288, filed Nov. 25, 2003, which is a continuation-in-part application of U.S. application Ser. No. 10/151,741, filed May 20, 2002, now U.S. Pat. No. 6,653,741, and further claims the benefit of U.S. Provisional Application No. 60/293,457, filed May 24, 2001, and U.S. Provisional Application No. 60/306,218, filed Jul. 18, 2001. The entire texts of each of these applications are incorporated herein by reference.

BACKGROUND OF THE INVENTION

Thermal interface materials (TIMs) are critical to protect active semiconductor devices, such as microprocessors, from exceeding the operational temperature limit. They enable thermal bonding of the heat generating device (e.g., a silicon semiconductor) to a heat sink or a heat spreader (e.g. copper and/or aluminum components) without presenting an excessive thermal barrier. Different TIMs may also be used in the assembly of other components of the heat sink or the heat spreader stack that comprise the overall thermal impedance path.

Formation of a small thermal barrier is an important property of a TIM. The thermal barrier can be described in terms of effective thermal conductivity through the TIM and is preferably as high as possible. The effective thermal conductivity of the TIM is primarily due to the interfacial heat transfer coefficient as well as the (intrinsic) bulk thermal conductivity of the TIM. A variety of other properties are also important for a TIM depending on the particular application, for example: an ability to accommodate or avoid thermal expansion stresses when joining two materials, an ability to form a mechanically sound joint that is stable during thermal cycling, a lack of sensitivity to moisture and temperature changes, manufacturing feasibility, and cost.

Several classes of materials are being currently used as TIMs, for example, thermal greases, thermal gels, adhesives, elastomers, thermal pads, and phase change materials. Although the foregoing TIMs are adequate for many current semiconductor devices, the increased performance of semiconductor devices in the near future will render the presently known TIMs inadequate. Specifically, the thermal conductivity of current non-metallic TIMs generally does not exceed about 5 W/mK and is typically less than about 1 W/mK. However, TIMs that form thermal interfaces with effective thermal conductivities of about 50 W/mK or greater will soon be needed.

One alternative to the foregoing non-metallic TIMs is a solid metal sheet or preform made of a typical solder alloy. The metal TIMs ensure high thermal conductivity value (e.g., about 80 W/mK for an indium sheet). Metal TIMs may also exhibit a favorable solder or wetting behavior upon reflow which facilitates a low thermal interfacial resistance. During reflow, the solder and substrate are heated, the solder melts and wets by surface tension and/or local surface alloying. The interfaces consist of intermetallics or interdiffused metals with thermal properties that are frequently less desirable than those of the bulk TIM metal but much better than existing (polymer based) TIMs. In most cases, metallic TIMs have to be subjected to reflow in order to form reliable thermal interfaces. Metallic TIMs, however, can fail in certain applications due to the relatively large difference(s) between the coefficients of thermal expansion (CTEs) of the TIM and the semiconductor and/or heat sink components and the lack of compliance.

SUMMARY OF THE INVENTION

Briefly, therefore, this invention is directed to a thermal interface material for bonding components of electronic devices, the thermal interface material comprising a solder component comprising a bonding component selected from the group consisting of In, an In—Sn alloy, a Au—Sn alloy, a Bi alloy, and mixtures thereof; and an additive component selected from among i) a CTE modifying component having a coefficient of thermal expansion that is less than about 10 $\mu m/m° C.$, ii) a thermal conductivity enhancement component having a thermal conductivity that is at least about 100 W/mK, and iii) combinations thereof.

The invention is also directed to a thermal interface material for bonding components of electronic devices, the thermal interface material comprising a solder component comprising a bonding component selected from the group consisting of In, Cu, Au, Sn, Pb, Sb, Ag, alloys thereof, Bi alloys, and mixtures thereof; and an additive component selected from among i) a CTE modifying component having a coefficient of thermal expansion that is less than about 10 $\mu m/m° C.$, ii) a thermal conductivity enhancement component having a thermal conductivity that is at least about 100 W/mK, and iii) combinations thereof; and an intrinsic oxygen getter selected from the group consisting of rare earth metals, alkali metals, alkaline-earth metals, refractory metals, Zn, and mixtures and alloys thereof.

In another aspect the invention is directed to an active solder that wets metallic and non-metallic surfaces without extrinsic fluxing, the active solder comprising a bonding component selected from the group consisting of In, Cu, Au, Sn, Pb, Sb, Ag, alloys thereof, Bi alloys, and mixtures thereof, and an intrinsic oxygen getter selected from the group consisting of rare earth metals, alkali metals, alkaline-earth metals, refractory metals, Zn, alloys thereof, and mixtures thereof.

The invention also encompasses an active solder that wets metallic and non-metallic surfaces without extrinsic fluxing, the active solder comprising a bismuth alloy bonding component, and an intrinsic oxygen getter selected from the group consisting of rare earth metals, alkali metals, alkaline-earth metals, refractory metals, Zn, alloys thereof, and mixtures thereof.

A further aspect of the invention is a multilayer solder preform for bonding components of electronic devices comprising a first solder preform layer comprising a solder metal bonding component and an additive selected from among thermal conductivity enhancement components, CTE modifying components, and mixtures thereof. There is a second solder metal preform layer comprising applied to the bottom surface of the first solder preform layer; and a third solder metal preform layer applied to the top surface of the first solder preform layer.

In another aspect the invention is a solder preform for bonding components of electronic devices comprising a sphere body comprising a sphere body solder metal bonding component and an additive component selected from among thermal conductivity enhancement components, CTE modifying components, and mixtures thereof. There is also a sphere body surface layer comprising a solder metal over the sphere body.

BRIEF DESCRIPTION OF THE DRAWINGS

FIG. 1 is a cross-sectional view of a conventional semiconductor device/heat sink configuration.

FIG. 2 is a cross-sectional view of an embodiment of the semiconductor device/heat sink configuration of the present invention.

FIG. 3 is a cross-sectional view of an embodiment of the semiconductor device/heat sink configuration of the present invention.

DETAILED DESCRIPTION OF THE INVENTION

Improvements in electronic device performance are frequently accompanied by increased power consumption and decreased device size, which independently or cooperatively may result in increased power densities. Therefore, the flow of heat from the operating electronic device must be increased to keep the device below its operational temperature limit. The present invention is directed to high performance TIM materials including a solder component and other components as described below to increase the flow of heat from an electronic device, and provide other advantages as are described. The TIM includes a thermal conductivity enhancement component in applications where it is desirable to further enhance thermal transmission through the solder, a CTE modifying component where it is desirable to address thermal mismatch, and both where both are desirable. An intrinsic oxygen getter can optionally be used in any of these applications.

The present invention also includes a solder preform having enhanced wettability to an electronic device substrate. In certain instances the solder preform functions as a TIM, but in other applications where heat transfer is not critical or is otherwise inherently adequate, the preform does not function as a TIM.

A. Solder

The high performance TIM comprises a solder that allows the TIM to bond to a substrate. As used herein, the term "substrate" refers to a semiconductor and/or a heat sink component and/or any other article, device, apparatus, etc. which is joined to another such "substrate" with the TIM. When thermally processed, the TIM should bond to the substrate at a temperature less than the failure temperature of an active (electronic) device (e.g., below about 350° C., preferably below about 250° C., and more preferably below about 200° C.). The solder melts below the active device failure temperature, wets to the substrate and allows the formation of a chemical and/or mechanical bond that effects good heat transfer between the TIM and the substrate when solidified. In general, the solder melts at a temperature less than about 300° C., preferably less than about 225° C. In certain embodiments the solder melts at a temperature of less than about 170° C., such as between about 160° C. and about 95° C.

The solder may comprise a conventional soldering material which requires an adjustment of the CTE. For example, the solder may comprise Sn, Cu, In, Pb, Sb, Au, Ag, alloys of each of the foregoing, such as Au—Sn, Au—Si, Au—Ge, and others such as Bi alloys. Or, for example, the solder may comprise In, an In—Sn alloy, a Au—Sn alloy, or a Bi alloy. Preferably, the solder comprises a bonding component with a low melting temperature and a relatively high thermal conductivity compared to conventional TIM materials (less than about 5 W/mK). For example, In (melting point is about 155 EC, thermal conductivity is about 80 W/mK), Sn (melting point is about 230° C., thermal conductivity is about 70 W/mK), and mixtures and alloys thereof. In one embodiment, the bonding component consists essentially of In because of its low melting temperature and its ability to readily wet many oxides, ceramics, and cermets without the use of organic fluxing agents.

In one embodiment the solder component is a Sn—Bi—Ag alloy comprising about 39 to about 61 wt % Sn, about 37 to about 59 wt % Bi, and about 1 to about 3% Ag. In another embodiment it is a Bi—Ag alloy comprising 80-97 wt % Bi and 3-20 wt % Ag.

B. Thermal Conductivity Enhancement Components

To increase heat flow through the TIM in a preferred embodiment of the invention, the TIM comprises a thermal conductivity enhancement component. The thermal conductivity enhancement component preferably has a thermal conductivity above about 100 W/mK. Preferred thermal conductivity enhancement component materials are Al, Al-coated Cu, Cu, Ag, Au, or alloys thereof. Ag, Cu, and Au have thermal conductivities of about 425 W/mK, about 400 W/mK and about 315 W/mK, respectively. Such metals typically have relatively high melting temperatures (e.g., the melting point of Ag is about 960° C., of Cu is about 1,085° C., and of Au is about 1,065° C.). Other preferred components are high thermal conductivity ceramics such as, but not limited to, AlN, BeO, BN, high conductivity cermets, cuprates, and silicides. Another class of preferred thermal conductivity enhancement components are carbon and carbon phases including diamond, carbon nano-tubes, and related derivatives.

The thermal conductivity enhancement component is incorporated into the solder in an amount ranging from about 1 wt % to about 50 wt %. For many applications, it is preferred to incorporate between about 5 wt % and about 20 wt % thermal conductivity enhancement component, such as 6 wt % Al, into the solder.

C. CTE Modifying Components

Heat flow through a TIM can be improved by preventing degradation in the intimate contact at the interfacial region over the life of the electronic device. Specifically, the differences between the coefficients of thermal expansion for the various components in an electronic package create stress during thermal cycling which can lead to partial or complete separation at the interfacial region. This problem is particularly acute for TIMs comprising materials with high coefficients of thermal expansion compared to typical semiconductor materials such as silicon, germanium, gallium arsenide, cadmium sulfide, and indium antimonide, and light emitting diode material including solid state emitters for photonic and fiber optic laser applications (e.g., In/As/GaAs and InAs/Al/Sb). Typically, the bonding component materials and thermal conductivity enhancement component materials have CTEs that are greater than about 16 µm/m° C. and the substrate material has a CTE less than about 10 µm/m° C.

The TIM of the present invention minimizes the negative impact of the CTE mismatch by preferably comprising a CTE modifying component. The CTE modifying component has a CTE that is more compatible with the substrate thereby decreasing the thermal stress upon thermal cycling. The CTE modifying component has a CTE that is preferably less than about 10 µm/m° C. and more preferably less than about 8 µm/m° C. Exemplary CTE modifying component materials include beryllium oxide (about 8.8 µm/m° C.), aluminum oxide (about 6.5-7.0 µm/m° C.), aluminum nitride (about 4.2 µm/m° C.), silicon carbide (about 4.0 µm/m° C.), silicon dioxide (about 0.5 µm/m° C.), low expansion iron-nickel alloys commonly referred to as KOVAR or INVAR (about 5.2

μm/m° C. to about 6.0 μm/m° C.), low expansion ceramic or glass powders (about −1.0 μm/m° C. to about 9.0 μm/m° C.), molybdenum, and mixtures thereof. In a preferred embodiment of the present invention the CTE modifying component comprises low expansion iron-nickel alloys because they have a very low CTE, are readily wetted by and incorporated into the solder alloy, have a relatively high thermal conductivity, and have a relatively high ductility which makes them amenable to post-alloying processing (e.g., rolling and extrusion). Preferably, the CTE mismatch between the TIM and the substrate is between about 5 μm/m° C. and about 30 μm/m° C. More preferably, the CTE mismatch between the TIM and the substrate is between about 5 μm/m° C. and about 20 μm/m° C. Still more preferably, the CTE mismatch between the TIM and the substrate is less than about 10 μm/m° C. Most preferably, the TIM is tailored for the desired CTE mismatch for the particular application.

Although the amount of solder and CTE modifying component depends on the particular application, the TIM preferably comprises about 30% to about 90% by volume of solder and about 10% to about 70% by volume of CTE modifying component (or of the CTE modifying component, plus thermal conductivity enhancement component, plus other additions, if applicable). In most embodiments the TIM comprises about 50% to about 90% by volume of the solder and about 10% to about 50% by volume of the CTE modifying component (or of the CTE modifying component, plus thermal conductivity enhancement component, plus other additions, if applicable).

In one embodiment of the invention, the CTE modifiers and/or the thermal conductivity enhancement additives can be pre-wet with a solder to ensure bonding with the bonding component during reflow. In particular, certain of the additives may be coated with a thin layer of the solder by any appropriate method such as plating, thermal spraying, vacuum deposition, or reduction processing. In contrast, in the preferred embodiments, the above-described thermal conductivity enhancement components and CTE modifying components are uncoated and are not pre-wet, and in this sense these components consist only of the above-noted specifically recited elements or compounds. This avoids an added operation and added expense, making the solder simpler and less expensive to manufacture. Accordingly, there is a distinct advantage of using components consisting only of the additives, without surface modification or coating for wetting.

D. Blending

The components of solder, thermal conductivity enhancer, and/or CTE modifier are typically in the form of powder or attrited particulates which must be blended. These components can be combined by powder blending, green compaction, then wrought metal processing to yield strip (ribbon) or foil subsequently processed into preforms.

An alternative method achieves combination of the additives with the solder by high shear vacuum mixing of the powder or particulate into molten solder. This high shear vacuum mix provides sufficiently aggressive mixing that the components become sufficiently dispersed without a need to pre-wet the additives. In particular, it has been discovered that this aggressive mixing permits the invention to be carried in the preferred manner described above where the additives and are not pre-wet, making the solder simpler and less expensive to manufacture.

A further alternative method for combining involves physical vapor deposition (PVD) of the solder onto the surface of the additive. This yields a thermal conductivity enhancement component or CTE modifier coated with solder material, which can then be incorporated into a solder paste. Or the powder can be compacted and directly wrought, or sintered and wrought.

A further alternative method is to co-spray the additives and solder by thermal spray, plasma spray, or other spray methods involving melting of the solder. One preferred alternative is kinetic spraying as disclosed in U.S. Pat. No. 6,283,386 (incorporated by reference), in which the powder components are bonded by cold welding. This kinetic spraying method is preferred due to reduced formation of oxides, and the ability to directly form solder preforms. This technology is available from Delphi Technologies, Inc. of Troy, Mich.

E. Intrinsic Oxygen Getter Components

In addition to increasing the heat flow through the TIM by selecting heat conductive solder materials and using thermal conductivity enhancers, a significant improvement in the heat flow from the source to substrate is realized by increasing the heat transfer coefficient at the interface. In fact, the resistance to heat flow at such an interface can be up to about two orders of magnitude greater than the resistance of the TIM. The primary cause of a low interfacial heat transfer coefficient is often the formation of areas at the interface in which the substrate and the TIM are not in intimate contact. Thus, those areas act as insulation and reduce the heat flow away from the heat source. A secondary cause of reduced heat transfer through the interface is the presence of various intermetallic phases exhibiting higher thermal resistance. Preferably, the interfacial heat transfer coefficient of the TIM is greater than about 50 W/cm$^2$° C. and more preferably greater than about 500 W/cm$^2$° C.

Typically, a TIM used to join a semiconductor (or a metalized semiconductor) and a heat sink requires mechanical and/or chemical fluxing to remove oxygen from the surfaces of the TIM, the semiconductor substrate, and the heat sink component to activate the joining process and allow the TIM to wet the surfaces. Chemical fluxing is typically used when attempting to join items with conventional solders at temperatures below about 300° C. A typical chemical flux comprises compounds which upon being heated become active and remove surface oxides. However, some of the flux materials do not escape and form insulating pockets or voids at the interfacial region and/or form residues that may be harmful for the operation of the device.

In accordance with certain embodiments of the present invention, the TIM (including the solder) preferably does not require extrinsic fluxing (i.e., mechanical fluxing and organic and inorganic fluxing compounds are not needed). Rather, in these embodiments the solder in the TIM of the present invention is preferably activated by an intrinsic oxygen getter that is mixed or alloyed with the bonding component. The intrinsic oxygen getter is more reactive with oxygen than the bonding component thereby preventing or minimizing the formation of bonding component-oxygen compounds. Exemplary intrinsic oxygen getters include alkali metals (e.g., Li, Na, and K), alkaline-earth metals (e.g., Mg and Ca), zinc, refractory metals (e.g., Ti, Zr, Hf, Ta, V, and Nb), rare earth metals (e.g., La, Ce, Pr, Nd, Sm, Eu, Gd, Tb, Dy and Yb), and mixtures and alloys thereof (e.g. misch metal which is available, for example, from Alfa Aesar of Ward Hill, Mass., USA at a composition that comprises about 50% by weight Ce, about 22% La, about 18% Nd, about 6% Pr and about 0-4% of Yb, Sm, Gd, Eu, Tb and Dy). Preferably, the total concentration of refractory metals in the solder is less than about 10% by weight, the total concentration of rare earth metals is less than about 5% by weight, and the total concentration of alkali, alkaline-earth and zinc is less than about 20% by weight.

In one exemplary embodiment, the TIM comprises indium as the solder, and titanium and misch metal as oxygen getters to provide a compliant yet high CTE alloy that is substantially molten above about 157° C. Preferably, it comprises about 0.5 to about 2% by weight Ti and about 0.1 to about 2.0% by weight misch metal with remainder being In. More preferably, it comprises about 1% by weight Ti, and about 0.2% by weight misch metal with the remainder being In. This has been found to yield a compliant TIM solderabled with a very low level of interfacial defects, and therefore less likely to fail at the interface as a result of thermal cycling.

In yet another preferred embodiment, the solder is a rigid gold-based solder with a relatively low CTE (about 13-14 μm/m° C.) that is typically used to attach sub-mounts or secure fiber optics (e.g., gold-tin, gold-silicon and gold-germanium solders). Typically, for gold-tin alloys the concentrations of gold and tin range from about 75 to about 85% by weight and from about 15 to about 25% by weight, respectively. For gold-silicon alloys the concentration of gold is at least about 90% and the concentration of silicon ranges from about 1 to about 5% by weight. For gold-germanium alloys the concentration of gold is at least about 80% and the concentration of germanium ranges from about 5 to about 15% by weight. To provide relatively low melting or reflow temperatures the solder compositions are preferably near the eutectic composition (e.g., the constituents are within about 3% by weight of the eutectic composition). The eutectic compositions are about 80Au-20Sn, about 97Au-3Si and about 88Au-12Ge. The near eutectic gold-tin alloy is particularly preferred for many applications because it is molten above about 280° C. Because these gold-based solders contain significantly less oxidizable material, less intrinsic oxygen getter materials are needed. Specifically, the concentration of intrinsic oxygen getter materials is preferably about half that of the indium based solder. Preferably the total concentration of refractory metals in the solder is less than about 5% by weight, the total concentration of rare earth metals is less than about 3% by weight, and the total concentration of alkali, alkaline-earth and zinc is less than about 10% by weight. More preferably, the total concentration of refractory metals is about 0.5 to about 1.5% by weight, the total concentration of rare-earth metals is about 0.01 to about 0.5% by weight, the total concentration of alkali metals is about 0.1 to about 0.5% by weight, the total concentration of alkaline-earth metals is about 0.1 to about 0.5% by weight, and the total concentration of zinc is about 0.1 to about 0.5% by weight. These lower CTE alloys are also less likely to fail than non-compliant high-CTE alloys at a semiconductor/solder interface as a result of thermal cycling.

In addition to eliminating the need for extrinsic fluxing, the active solder and the thermal interface material comprising the active solder are able to wet non-metallic surfaces such as, but not limited to, Si, SiO2, SiN, and II-IV and III-V semiconductor. As a result, wettable metallizations such as, but not limited to, Au, Au/Ni, Ni, Cu, Sn and combinations thereof are not required to be deposited on such non-metallic surfaces before a soldering/bonding operation. This ability to bond to non-metallic surface provides a significant materials and process benefits.

The TIM and active solder of the present invention are particularly suited for thermal processing at temperatures below about 300° C. and preferably below about 200° C. However, the TIM and active solder of the present invention may be thermal processed at elevated temperatures (e.g., greater than about 500° C.) to provide more effective wetting (e.g., shorter wetting time).

A function of the intrinsic gettering components which is independent of the substrate surface wetting is that the intrinsic gettering components wet the above-described additive components, and facilitate dispersion of these additives in the solder metal. This permits the use of additives such as thermal conductivity enhancers and CTE modifiers which otherwise would be difficult to use or would require pre-wetting.

In addition to improving solder processes where the heat flow across the interface is critical, the foregoing active solders are particularly useful in the manufacture of opto-electronic packages. Specifically, active opto-electronic packages comprise lasing devices. If the beam intercepts any organic residue from a chemical flux, the laser readily carbonizes the residue which can disable the device. The use of a fluxless soldering process eliminates this potential failure mechanism.

The solder having this intrinsic gettering component may be formed by any available inert melting method such as melting by induction in an inert crucible or by arc melting. The system is evacuated and back filled with a non-reactive inert gas such as argon. The metals are heated preferably above about 1000° C. to ensure adequate dissolution of the alloy constituents. In a particularly preferred version, at this temperature and environment the additives and solder are combined by high shear vacuum mixing of the powder or particulate into molten solder as described above. This high shear vacuum mix provides sufficiently aggressive mixing that the components become sufficiently dispersed without a need to pre-wet the additives. This method can achieve mixing temperatures under vacuum where the active additions are highly effective and wetting to ceramics, cermets, and other difficult substrates can be readily achieved.

After melting and mixing, the composite melt is then cast as an ingot for subsequent wrought processing. The molten alloy is cast or formed and mechanically worked into a wire, a tape or a preform for use in the production of the TIM.

F. Solder Preform Having Enhanced Wetting Characteristics

A solder which is highly filled with a thermal conductivity enhancement component and/or a CTE component typically has low metallurgical fluidity. This low fluidity impairs capillary flow essential to good solder fillet formation. This problem is addressed in one embodiment of this invention by producing a solder preform. This solder preform functions as a TIM in certain applications, but in other applications where enhancing heat transfer is not critical or is otherwise inherently adequate, the preform does not function as a TIM. This preform structure is applicable to both TIM and non-TIM bonding applications. The preform in one embodiment is a multi-layer solder preform having an interior filled solder component and an exterior unfilled solder component. The interior solder component, being filled, provides the desired characteristics such as CTE modification and/or thermal conductivity enhancement imparted by the filler. The exterior solder component, being unfilled, provides good metallurgical fluidity for good wettability to the substrate. "Filled" in this context refers to a solder bonding component into which is admixed a portion of CTE modifying component, and/or thermal conductivity enhancement component. "Filled" means partially filled and does not mean completely filled. "Unfilled" in this context refers to a solder bonding component containing no such additives, or at least no such additives in significant enough of a proportion to significantly reduce metallurgical fluidity. There are preferably unfilled solder layers on each side of a filled solder layer. The respective layers are formed and combined by a variety of available methods, including roll bonding of respective strips of solder material, spraying, plating onto a solder strip or other solder substrate, physical deposition such as PVD, or chemical deposition such as CVD.

One such embodiment of the solder preform is a multilayer solder preform having a first solder preform layer which is a solder bonding component which is filled with an additive selected from among thermal conductivity enhancement components, CTE modifying components, and mixtures thereof. There are second and third unfilled solder layers applied, respectively, to the top surface and bottom surface of the first layer. The solder bonding component of the first layer, and the solder component of the second and third layers, are typically selected from among Sn, Cu, In, Pb, Sb, Au, Ag, alloys thereof, Bi alloys, and mixtures thereof.

In embodiments which incorporate a thermal conductivity enhancement component, any such component which is compatible with the solder bonding component may be used. Examples of such components include the aforementioned Al, Al-coated Cu, Ag, Au, and alloys thereof, AlN, BeO, BN, high conductivity cermets, cuprates, silicides, and carbon phases. In embodiments incorporating a CTE modifying component, any such component which is compatible with the bonding component may be used. Examples of such components include the aforementioned components selected from the group consisting of BeO, $Al_2O_3$, AlN, SiC, $SiO_2$, low expansion Fe—Ni alloys, low expansion ceramic powders, low expansion glass powders and mixtures thereof. In a preferred embodiment, the CTE modifying component consists essentially of the particular element or compound in that it is not pre-wet; that is, it is uncoated.

The first layer may also include an intrinsic oxygen getter which is compatible with the solder metal bonding component. Examples of suitable intrinsic oxygen getters includes components selected from the group consisting of rare earth metals, alkali metals, alkaline-earth metals, refractory metals, Zn, and mixtures thereof. In view of the overall enhanced metallurgical fluidity provided by the solder preform of the invention, however, intrinsic oxygen getters are not typically employed for purposes of wetting the substrate surface. However, a function of the intrinsic gettering components which is independent of the substrate surface wetting is that the intrinsic gettering components wet the above-described additive components, and facilitate dispersion of these additives in the solder metal. This permits the use of additives such as thermal conductivity enhancers and CTE modifiers which otherwise would be difficult to use or would require pre-wetting.

During solder reflow the unfilled solder layers, the second and third layers, are unimpaired by the filler, and readily flow and wet the surface of the substrate. Interface intermetallics at least substantially consume the unfilled solder to yield a fillet that is essentially all enhanced material.

In one embodiment the thickness of the first solder preform layer is between about 0.001 (0.025 mm) and about 0.125 inch (3 mm), and the thickness of each of the second and third layers is between about 0.0001 (0.0025 mm) and about 0.02 inch (0.5 mm).

An alternative embodiment of the solder preform for bonding components of electronic devices comprises a sphere body with a sphere body surface layer thereover. The sphere body comprises a solder metal bonding component and is filled with an additive component selected from among thermal conductivity enhancement components, CTE modifying components, and mixtures thereof. The solder metal bonding component in the sphere body, as well as the sphere body surface layer thereover, may be selected from among, for example, the group consisting of Sn, Cu, In, Pb, Sb, Au, Ag, alloys thereof, Bi alloys, and mixtures thereof.

One method for preparing the sphere body is to stamp a disk of solder material from a solder strip. A sphere is then formed by reflowing the stamped disk in a column of hot oil. The solder spheres are then coated with unfilled solder material by plating, physical deposition, chemical deposition, or spraying. In one typical embodiment, the sphere body has a diameter of between about 0.003 inch (0.075 mm) and about 0.06 inch (1.5 mm), and the sphere body surface layer is between about 0.0005 inch (0.0125 mm) and about 0.05 inch (1.25 mm) thick.

G. Alternative TIM Forms

The high performance TIM of the present invention may be manufactured as a foil or a mesh in which openings are formed (e.g., by punching or etching) and the openings are filled with one or more of the additives. For example, an indium-based foil with hexagonally spaced openings may be filled with beryllium oxide. In the case of a copper foil or mesh, the copper is coated with a bonding component such as indium (e.g., by dipping or plating). A suitable diffusion barrier component (e.g., nickel, titanium or other transitional metals) may be required to prevent rapid dissolution of copper into the indium during the melting/bonding process. An additional method is the use of a sponge comprising a bonding component and/or a thermal conductivity enhancement component (e.g., 90% theoretical density) filled with the CTE modifying component. If necessary, the sponge may be cut into thin sheets to achieve the desired thickness.

H. CTE Mismatch Resistant Semiconductor Substrate/Heat Sink Interface

Among many devices in which the above-described TIM and solder preform of the invention can be used, there is an interface for connecting a semiconductor substrate and heat sink components which reduces or eliminates the negative impact of CTE mismatch between a TIM and the substrates. Thus, the improved interface increases the critical range of the CTE mismatch.

Referring now to FIG. 1, the typical semiconductor/heat sink configuration of an electronic device package 1 comprises a semiconductor substrate 2 having a front surface 3 and a back surface 4, an electronic device (not pictured) being located on the front surface, a first thermal interface material 5 which bonds the back surface 4 of the semiconductor substrate 2 to a heat sink component 6 having a front surface 7, the heat sink component comprises a heat exchanger 8 having a back surface 9 and a front surface 10, and optionally, a lid 11 having a back surface 12 and a front surface 13. If the optional lid 11 is included, a second thermal interface material 14 bonds the back surface of the lid 12 to the front surface 10 of the heat exchanger 8. In accordance with the present invention, the above-described high performance thermal interface material may be used to compensate for the CTE mismatch between the substrate and the lid and between the lid and the heat exchanger in such a typical electronic device package.

Referring now to FIG. 2, the present invention is directed to an electronic device package 1 comprising a semiconductor substrate 2 having a front surface and a back surface, and an electronic device (not pictured) on the front surface of the semiconductor substrate. The package also comprises a lid 11 which comprises a recess 15 for receiving an insert 16 which is sized and shaped to fit within the recess. In this embodiment, the recess extends inward from the front surface of the lid to a point between the front surface and the back surface of the lid. The insert comprises a front surface 17, a back surface 18, and a surface in contact with the lid 19. The electronic device package further comprises a first thermal interface material 5 which bonds the back surface of the substrate 2 to the front surface 17 of the insert 16. Preferably, the package also comprises a second thermal interface material 14 which bonds the back surface 12 of the lid 11 to the heat exchanger 8. The insert comprises a thermal stress relieving material that has a CTE that more closely matches the CTE of the substrate than does the CTE of the lid (see supra). Stated another way, the CTE of the insert is between the CTE of the lid and the CTE of the substrate. Therefore, the first thermal interface material need only accommodate the relatively small CTE mismatch between the insert and the substrate rather than the larger CTE mismatch between the substrate and the lid. As a result, the greatest CTE mismatch is typically between the insert/lid interface and because the CTE of the insert is typically smaller than that of the lid, the insert can be compression mounted within the lid.

Referring now to FIG. 3, the recess 15 may extend through the lid 11 (i.e., the recess extends from the front surface to the back surface of the lid) and likewise the insert 16 may extend completely through the lid 11. As a result, the second thermal interface material 14 also bonds the insert 16 to the heat exchanger 8.

In view of the above, it will be seen that the several objects of the invention are achieved. As various changes could be made in the above compositions and processes without departing from the scope of the invention, it is intended that all matter contained in the above description be interpreted as illustrative and not in a limiting sense.

What is claimed is:

1. A thermal interface material for bonding components of electronic devices, the thermal interface material comprising:
   a solder component selected from the group consisting of indium, gold, bismuth, tin, lead, antimony, silver, and mixtures and alloys thereof; and
   a thermal conductivity enhancement component having a thermal conductivity that is at least about 100 W/mK;
   wherein the thermal interface material has a reflow temperature less than about 225° C.

2. The thermal interface material of claim 1 wherein the thermal interface material has a reflow temperature less than about 200° C.

3. The thermal interface material of claim 1 wherein the thermal conductivity enhancement component is selected from the group consisting of Al, Ag, Cu, Al-coated Cu, Au, AlN, BeO, BN, high conductivity cermets, cuprates, silicides, carbon phases, and mixtures thereof.

4. The thermal interface material of claim 3 wherein the thermal conductivity enhancement component is selected from the group consisting of silver, copper, gold, and mixtures and alloys thereof.

5. The thermal interface material of claim 1 wherein the thermal interface material comprises from about 1% to about 5% by weight of the thermal conductivity enhancement component.

6. The thermal interface material of claim 1 comprising indium as the solder component.

7. The thermal interface material of claim 1 comprising an indium-tin alloy as the solder component.

8. The thermal interface material of claim 1 comprising a gold-tin alloy as the solder component.

9. The thermal interface material of claim 1 comprising a silver-tin alloy as the solder component.

10. The thermal interface material of claim 1 comprising, as the solder component, gold and a second metal selected from the group consisting of tin, silicon, germanium, and mixtures and alloys thereof;
    wherein the solder component comprises 75 to 85% by weight gold and 15 to 25% by weight tin, or the solder component comprises at least 90% by weight gold and 1 to 5% by weight silicon, or the solder component comprises at least 80% by weight gold and 5 to 15% by weight germanium.

11. A thermal interface material for bonding components of electronic devices, the thermal interface material comprising:
    a solder component selected from the group consisting of indium, gold, bismuth, tin, lead, antimony, silver, and mixtures and alloys thereof; and
    a thermal conductivity enhancement component having a thermal conductivity that is at least about 100 W/mK; and
    a CTE modifying component selected from the group consisting of molybdenum, beryllium oxide, aluminum oxide, aluminum nitride, silicon carbide, silicon dioxide, low expansion iron-nickel alloys, low expansion ceramic powders, low expansion glass powders, and mixtures thereof;
    wherein the thermal interface material has a reflow temperature less than about 225° C.

12. The thermal interface material of claim 11 wherein the CTE modifying component is uncoated.

13. The thermal interface material of claim 11 wherein the CTE modifying component comprises molybdenum.

14. The thermal interface material of claim 11 wherein the thermal interface material comprises about 10% to about 70% by volume of the CTE modifying component.

15. The thermal interface material of claim 11 wherein the thermal interface material comprises about 10% to about 70% by volume of the CTE modifying component.

16. The thermal interface material of claim 11 comprising, as the solder component, Sn or an alloy thereof.

17. The thermal interface material of claim 11 comprising, as the solder component, Pb or an alloy thereof.

18. The thermal interface material of claim 11 comprising, as the solder component, Ag or an alloy thereof.

19. The thermal interface material of claim 11 further comprising an intrinsic oxygen getter selected from the group consisting of rare earth metals, alkali metals, alkaline-earth metals, refractory metals, zinc, and mixtures and alloys thereof.

20. The thermal interface material of claim 19 further comprising an intrinsic oxygen getter selected from the group consisting of lithium, sodium, potassium, magnesium, calcium, titanium, zirconium, hafnium, tantalum, vanadium, niobium, lanthanum, cerium, praseodymium, samarium, neodymium, europium, gadolinium, terbium, dysprosium, ytterbium, zinc, and mixtures and alloys thereof.

21. The thermal interface material of claim 20 wherein the intrinsic oxygen getter comprises zinc.

22. A thermal interface material for bonding components of electronic devices, the thermal interface material comprising:
    a solder component selected from the group consisting of indium, gold, bismuth, tin, lead, antimony, silver, and mixtures and alloys thereof; and
    a thermal conductivity enhancement component having a thermal conductivity that is at least about 100 W/mK;
    wherein the thermal interface material has a reflow temperature less than about 250° C., the thermal interface material comprising a multilayer solder preform structure wherein the solder component constitutes a first layer comprising the bonding component filled with the additive component, and wherein the first layer is interposed between a second layer and a third layer, wherein the second and third layers comprise solder metal selected from the group consisting of Sn, Cu, In, Pb, Sb, Au, Ag, alloys thereof, Bi alloys, and mixtures thereof.

23. The thermal interface material of claim 22 wherein the first layer has a thickness between about 0.001 inch (0.025 mm) and about 0.125 inch (3 mm), and the second and third layers each have a thickness between about 0.0001 inch (0.0025 mm) and about 0.02 inch (0.5 mm).

24. A thermal interface material for bonding components of electronic devices, the thermal interface material comprising:
   a solder component selected from the group consisting of indium, gold, bismuth, tin, lead, antimony, silver, and mixtures and alloys thereof; and
   a thermal conductivity enhancement component having a thermal conductivity that is at least about 100 W/mK; wherein the thermal interface material has a reflow temperature less than about 250° C., the thermal interface material comprising a spherical solder preform comprising a sphere body and a sphere body surface layer, wherein the sphere body comprises the bonding component filled with the additive component, and wherein the sphere body surface layer comprises a layer of unfilled solder metal selected from the group consisting of Sn, Cu, In, Pb, Sb, Au, Ag, alloys thereof, Bi alloys, and mixtures thereof.

25. The thermal interface material of claim 24 wherein the sphere body has a diameter of between about 0.003 inch (0.075 mm) and about 0.06 inch (1.5 mm), and the sphere body surface layer has a thickness between about 0.0005 inch (0.0125 mm) and about 0.05 inch (1.25 mm).

26. A thermal interface material for bonding components of electronic devices, the thermal interface material comprising:
   a solder component comprising indium, 0.5 to 2% by weight of titanium, and 0.1 to 2% by weight of misch metal, wherein the concentration of the bonding component is between 30% and 90% by volume of the thermal interface material; and
   a thermal conductivity enhancement component having a thermal conductivity that is at least about 100 W/mK; wherein the thermal interface material has a reflow temperature less than about 250° C.

27. A thermal interface material for bonding components of electronic devices, the thermal interface material comprising:
   a solder component selected from the group consisting of indium, gold, bismuth, tin, lead, antimony, silver, and mixtures and alloys thereof; and
   a thermal conductivity enhancement component having a thermal conductivity that is at least about 100 W/mK; wherein the thermal interface material has a reflow temperature less than about 250° C., and the solder component wets metallic and non-metallic surfaces without extrinsic fluxing, the solder component comprising a bonding component selected from the group consisting of indium and indium-tin alloys, and further comprising an intrinsic oxygen getter selected from the group consisting of alkali metals, alkaline-earth metals, refractory metals, rare earth metals, zinc, and mixtures and alloys thereof.

28. A thermal interface material for bonding components of electronic devices, the thermal interface material comprising:
   a solder component selected from the group consisting of indium, gold, bismuth, tin, lead, antimony, silver, and mixtures and alloys thereof;
   a thermal conductivity enhancement component having a thermal conductivity that is at least about 100 W/mK; and
   a CTE modifying component selected from the group consisting of beryllium oxide, aluminum oxide, aluminum nitride, silicon carbide, silicon dioxide, low expansion iron-nickel alloys, low expansion ceramic powders, low expansion glass powders, and mixtures thereof;
   wherein the thermal interface material has a bulk thermal conductivity of at least about 30 W/mK.

29. The thermal interface material of claim 28 wherein the thermal conductivity enhancement component is selected from the group consisting of Al, Ag, Cu, Al-coated Cu, Au, AlN, BeO, BN, high conductivity cermets, cuprates, silicides, carbon phases, and mixtures thereof.

30. The thermal interface material of claim 29 wherein the thermal conductivity enhancement component is selected from the group consisting of silver, copper, gold, and mixtures and alloys thereof.

31. The thermal interface material of claim 28 wherein the thermal interface material comprises from about 1% to about 5% by weight of the thermal conductivity enhancement component.

32. The thermal interface material of claim 28 wherein the CTE modifying component comprises molybdenum.

33. The thermal interface material of claim 32 wherein the thermal interface material comprises about 10% to about 70% by volume of the CTE modifying component.

34. The thermal interface material of claim 32 wherein the thermal interface material comprises about 10% to about 70% by volume of the CTE modifying component.

35. The thermal interface material of claim 32 comprising, as the solder component, Sn or an alloy thereof.

36. The thermal interface material of claim 32 comprising, as the solder component, Pb or an alloy thereof.

37. The thermal interface material of claim 32 comprising, as the solder component, Ag or an alloy thereof.

38. The thermal interface material of claim 32 further comprising an intrinsic oxygen getter selected from the group consisting of rare earth metals, alkali metals, alkaline-earth metals, refractory metals, Zn, and mixtures and alloys thereof.

39. The thermal interface material of claim 38 further comprising an intrinsic oxygen getter selected from the group consisting of lithium, sodium, potassium, magnesium, calcium, titanium, zirconium, hafnium, tantalum, vanadium, niobium, lanthanum, cerium, praseodymium, samarium, neodymium, europium, gadolinium, terbium, dysprosium, ytterbium, zinc, and mixtures and alloys thereof.

40. The thermal interface material of claim 39 wherein the intrinsic oxygen getter comprises zinc.

* * * * *